United States Patent
Katrak et al.

(10) Patent No.: US 9,728,359 B1
(45) Date of Patent: Aug. 8, 2017

(54) DIAGNOSTIC SYSTEM FOR A VOLTAGE REGULATOR

(71) Applicant: LG Chem, Ltd., Seoul (KR)

(72) Inventors: Kerfegar K. Katrak, Fenton, MI (US); Kunal Tipnis, Troy, MI (US)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/247,392

(22) Filed: Aug. 25, 2016

Related U.S. Application Data

(60) Provisional application No. 62/352,159, filed on Jun. 20, 2016.

(51) Int. Cl.
*G05F 3/02* (2006.01)
*H01H 47/00* (2006.01)
*G01R 19/165* (2006.01)

(52) U.S. Cl.
CPC ..... *H01H 47/002* (2013.01); *G01R 19/16566* (2013.01); *G05F 3/02* (2013.01)

(58) Field of Classification Search
CPC ................................ H01H 47/002; G05F 3/02
See application file for complete search history.

(56) References Cited

U.S. PATENT DOCUMENTS

| | | | |
|---|---|---|---|
| 6,803,768 B2 | 10/2004 | Serratoni et al. | |
| 7,397,224 B2 | 7/2008 | Jabaji | |
| 7,923,976 B2 | 4/2011 | Al-Shyoukh et al. | |
| 8,892,914 B2* | 11/2014 | Huynh | G06F 1/26 713/300 |

* cited by examiner

*Primary Examiner* — Emily P Pham
(74) *Attorney, Agent, or Firm* — Buckert Patent & Trademark Law Firm PC; John F. Buckert

(57) ABSTRACT

A diagnostic system for a voltage regulator is provided. The diagnostic system includes a microcontroller having first and second analog-to-digital converters and first and second output ports. The first analog-to-digital converter outputs a first voltage value corresponding to the first voltage from the voltage regulator. The microcontroller executes a first diagnostic function to set a first voltage regulator diagnostic flag equal to a fault value indicating a voltage out of range condition, if the first voltage value is greater than a first threshold voltage value or the first voltage value is less than a second threshold voltage value. The microcontroller executes a second diagnostic function to stop generating first and second control signals to de-energize a contactor coil to open a contact of a contactor if the first voltage regulator diagnostic flag is equal to the fault value.

4 Claims, 6 Drawing Sheets

DIAGNOSTIC SYSTEM FOR A VOLTAGE REGULATOR

CROSS-REFERENCE TO RELATED APPLICATION

This application claims priority to U.S. Provisional Patent Application No. 62/352,159 filed on Jun. 20, 2016, the entire contents of which are hereby incorporated by reference herein.

BACKGROUND

The inventors herein have recognized a need for an improved diagnostic system for a voltage regulator. The diagnostic system provides a technical effect of implementing diagnostic diversity by utilizing a first voltage output by a voltage regulator or a second voltage output by a voltage step-down circuit coupled to the voltage regulator, to determine whether the voltage regulator is operating as desired, and if not then opening a contactor.

SUMMARY

A diagnostic system for a voltage regulator in accordance with an exemplary embodiment is provided. The diagnostic system includes a microcontroller having first and second analog-to-digital converters and first and second output ports. The diagnostic system further includes a first analog multiplexer having an input port and an output port. The output port of the first analog multiplexer is electrically coupled to the first analog-to-digital converter. The input port of the first analog multiplexer is electrically coupled to the voltage regulator. The diagnostic system further includes a second analog multiplexer having an input port and an output port. The output port of the second analog multiplexer is electrically coupled to the second analog-to-digital converter. The diagnostic system further includes a voltage step-down circuit having an input node and an output node. The input node of the voltage step-down circuit is electrically coupled to the voltage regulator. The output node of the voltage step-down circuit is electrically coupled to the input port of the second analog multiplexer. The first analog multiplexer receives a first voltage from the voltage regulator and outputs the first voltage to the first analog-to-digital converter. The first analog-to-digital converter outputs a first voltage value corresponding to the first voltage from the voltage regulator. The microcontroller is programmed to execute a first diagnostic function to set a first voltage regulator diagnostic flag equal to a fault value indicating a voltage out of range condition, if the first voltage value is greater than a first threshold voltage value or the first voltage value is less than a second threshold voltage value.

A diagnostic system for a voltage regulator in accordance with another exemplary embodiment is provided. The diagnostic system includes a microcontroller having first and second analog-to-digital converters and first and second output ports. The diagnostic system further includes a first analog multiplexer having an input port and an output port. The output port of the first analog multiplexer is electrically coupled to the first analog-to-digital converter. The input port of the first analog multiplexer is electrically coupled to the voltage regulator. The diagnostic system further includes a second analog multiplexer having an input port and an output port. The output port of the second analog multiplexer is electrically coupled to the second analog-to-digital converter. The diagnostic system further includes a voltage step-down circuit having an input node and an output node. The input node of the voltage step-down circuit is electrically coupled to the voltage regulator. The output node of the voltage step-down circuit is electrically coupled to the input port of the second analog multiplexer. The second analog multiplexer receives a first voltage from the output node of the voltage step-down circuit and outputs the first voltage to the second analog-to-digital converter. The second analog-to-digital converter outputs a first voltage value corresponding to the first voltage from the voltage step-down circuit. The microcontroller is programmed to execute a first diagnostic function to set a first voltage regulator diagnostic flag equal to a fault value indicating a voltage out of range condition, if the first voltage value is greater than a first threshold voltage value or the first voltage value is less than a second threshold voltage value.

DETAILED DESCRIPTION

Figure 1:
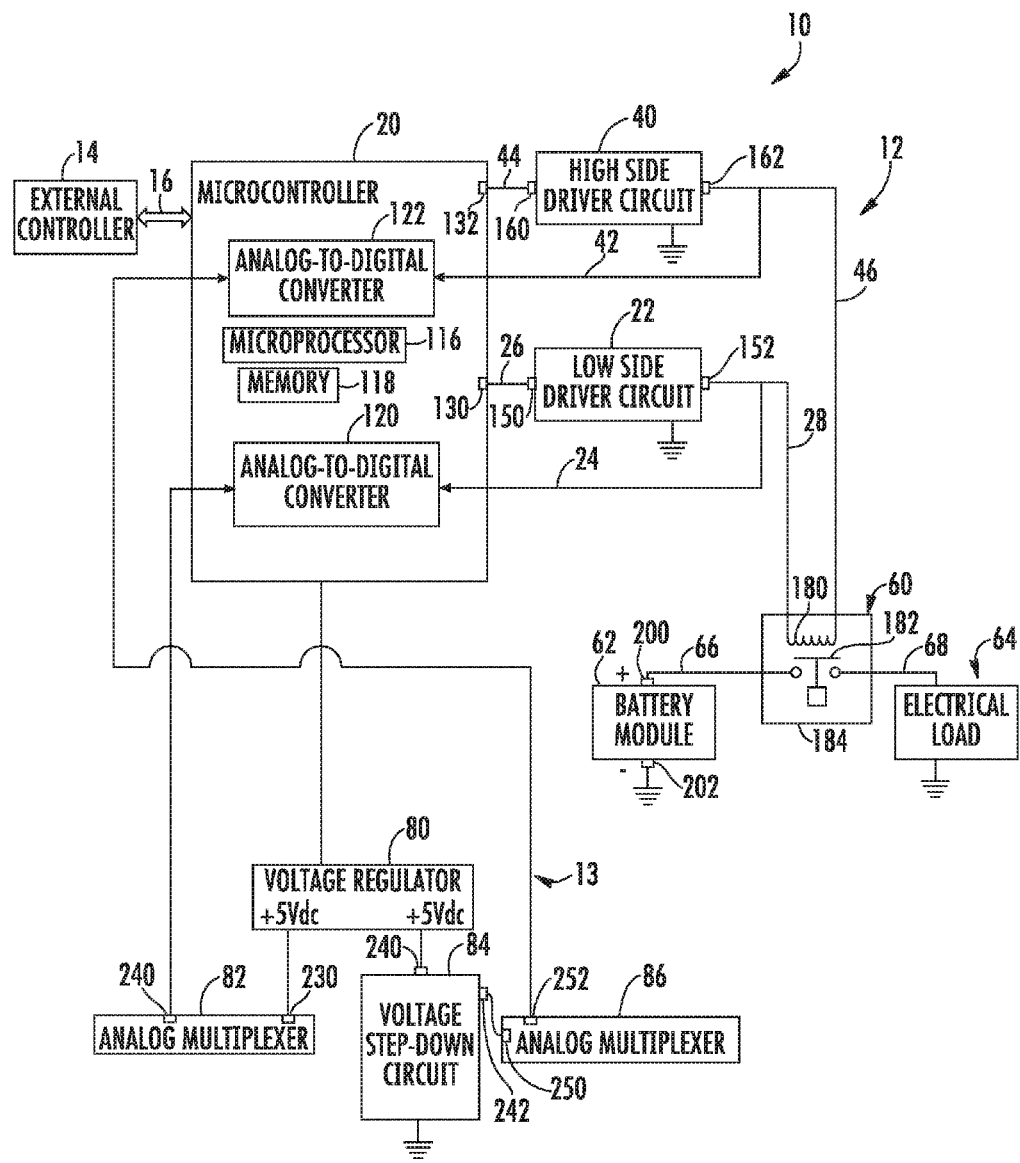
FIG. 1 is a schematic of a vehicle having a system for controlling operation of a contactor, a diagnostic system for a voltage regulator in accordance with an exemplary embodiment, an external controller, and a communication bus.

Referring to FIG. 1, a vehicle 10 includes a system 12 for controlling operation of a contactor 60, a diagnostic system 13, an external controller 14, and a communication bus 16. An advantage of the system 12 is that the system 12 implements diagnostic diversity by utilizing a first voltage output by a voltage regulator 80 or a second voltage output by a voltage step-down circuit 84 coupled to the voltage regulator 80, to determine whether the voltage regulator 80 is operating as desired, and if not then opening a contactor 60.

The system 12 includes a microcontroller 20, a low side driver circuit 22, a low side voltage sense line 24, electrical lines 26, 28, a high side driver circuit 40, a high side voltage sense line 42, electrical lines 46, 44, a contactor 60, a battery module 62, an electrical load 64, electrical lines 66, 68.

The microcontroller 20 includes a microprocessor 116, a memory 118, analog-to-digital converters 120, 122, and first and second output ports 130, 132. The microcontroller 20 is programmed to perform diagnostic steps (described in flowcharts herein) utilizing the microprocessor 116 which executes software instructions stored in the memory 118. The microprocessor 116 operably communicates with the memory 118, the analog-to-digital converters 120, 122, and the first and second output ports 130, 132. The first output port 130 controls whether a low side end of the contactor coil 180 is electrically coupled to electrical ground. The second output port 132 controls whether a high side end of the contactor coil 180 receives an energization voltage.

The low side driver circuit 22 has an input node 150 and an output node 152. The input node 150 is electrically coupled to the first output port 130 of the microcontroller 20 utilizing the electrical line 26. The output node 152 is electrically coupled to a low side end of the contactor coil 180 utilizing the electrical line 28. When the low side driver circuit 22 receives a first control signal from the first output port 130 of the microcontroller 20, the low side driver circuit 22 electrically couples the low side end of the contactor coil 180 to electrical ground. When the low side driver circuit 22 does not receive the first control signal from the first output port 130 of the microcontroller 20, the low side driver circuit 22 electrically de-couples the low side end of the contactor coil 180 from electrical ground.

The low side sense voltage sense line 24 is electrically coupled to and between the output node 152 of the low side driver circuit 22 and the analog-to-digital converter 120.

The high side driver circuit 40 has an input node 160 and an output node 162. The input node 160 is electrically coupled to the second output port 132 of the microcontroller 20 utilizing the electrical line 44. The output node 162 is electrically coupled to a high side end of the contactor coil 180 utilizing the electrical line 46. When the high side driver circuit 40 receives a second control signal from the second output port 132 of the microcontroller 20, the high side driver circuit 40 supplies an energization voltage to the high side end of the contactor coil 180. When the high side driver circuit 40 does not receive the second control signal from the second output port 132 of the microcontroller 20, the high side driver circuit 40 does not supply the energization voltage to the high side end of the contactor coil 180.

The high side sense voltage sense line 42 is electrically coupled to and between the output node 162 of the high side driver circuit 402 and the analog-to-digital converter 122.

The contactor 60 is electrically coupled in series between a positive terminal 200 of the battery module 62 and the electrical load 64. The contactor 60 includes the contactor coil 180, a contact 182, and a housing 184. The housing 184 holds the contactor coil 180 and the contact 182 therein. When the microcontroller 20 generates first and second control signals on the output ports 130, 132, respectively that are received by the low side driver circuit 22 and the high side driver circuit 40, respectively, the driver circuits 22, 40 energize the contactor coil 180, which moves the contact 182 to a closed operational position if the contactor 60 is operating as desired. Alternately, when the microcontroller 20 stops generating the first and second control signals, the driver circuits 22, 40 de-energize the contactor coil 180, which moves the contact 182 to an open operational position if the contactor 60 is operating as desired.

The battery module 62 includes a positive terminal 200 and a negative terminal 202. The battery module 62 generates a voltage between the positive terminal 200 and the negative terminal 202. The positive terminal 200 is electrically coupled to a first end of the contact 182 utilizing an electrical line 66.

The electrical load 64 is electrically coupled to a second end of the contact 182 utilizing an electrical line 68.

The diagnostic system 13 is provided to perform diagnostic tests on the voltage regulator 80 based on a first voltage output by the voltage regulator 80 and a second voltage output by the voltage step-down circuit 84. The diagnostic system 13 includes the microcontroller 20, the voltage regulator 80, an analog multiplexer 82, the voltage step-down circuit 84, and an analog multiplexer 86.

The voltage regulator 80 is provided to output an operational voltage (e.g., 5.0 Vdc) that is utilized to power the analog-to-digital converters 120, 122. In particular, the voltage regulator 80 is electrically coupled to the analog-to-digital converters 120, 122 for providing an operational voltage to the analog-to-digital converters 120, 122. Further, the voltage regulator 80 is electrically coupled to an input node 240 of the voltage step-down circuit 84 to provide a first voltage (e.g. 5.0 Vdc voltage) to the voltage step-down circuit 84. Further, the voltage regulator 80 is electrically coupled to an input node 230 of the analog multiplexer 82 to provide the first voltage (e.g. 5.0 Vdc) to the analog multiplexer 82.

The analog multiplexer 82 includes an input port 230 and an output port 240. The input port 230 is electrically coupled to the voltage regulator 80 and receives the first voltage (e.g. 5.0 Vdc voltage) therefrom. The output port 240 is electrically coupled to the analog-to-digital converter 120, and outputs the first voltage to the analog-to-digital converter 120.

The voltage step-down circuit 84 is provided to receive the first voltage (e.g. 5.0 Vdc voltage) from the voltage regulator 80 and to output a second voltage (e.g. 2.5 Vdc voltage) that is less than the first voltage. The first and second voltages can be utilized for diagnostic purposes relating to the voltage regulator 80. The voltage step-down circuit 84 includes an input node 240 and an output node 242. The input node is electrically coupled to the voltage regulator 80, and receives the first voltage (e.g. 5.0 Vdc voltage) therefrom. The output node 242 is electrically coupled to an input node 250 of the analog multiplexer 86, and outputs the second voltage (e.g., 2.5 Vdc voltage) therefrom. In an exemplary embodiment, the voltage step-down circuit 84 is a resistor voltage dividing circuit that uses first and second resistors coupled in series with an intermediate node therebetween. The first resistor is electrically coupled to the voltage regulator 80 and the second resistor is electrically coupled to electrical ground. The intermediate node between the first and second resistors is used to output the second voltage to the analog multiplexer 86. In an alternative embodiment, the voltage step-down circuit 84 is another voltage regulator that outputs the second voltage.

The analog multiplexer 86 includes an input port 250 and an output port 252. The input port 250 is electrically coupled to the output port 242 of the voltage step-down circuit 84 and receives the second voltage (e.g. 2.5 Vdc voltage) therefrom. The output port 252 is electrically coupled to the analog-to-digital converter 122, and outputs the second voltage to the analog-to-digital converter 122.

The external controller 14 operably communicates with the microcontroller 20 utilizing a communication bus 16. The external controller 14 can send a command message to the microcontroller 20 requesting that the contactor 60 be transitioned to an open operational position such that an operational voltage from the battery module 62 is removed from the electrical load 64 to de-energize the electrical load 64.

Referring to FIGS. 1-6, a flowchart of a method for performing diagnostic tests on the voltage regulator 80 in accordance with another exemplary embodiment will now be described.

Figure 2:
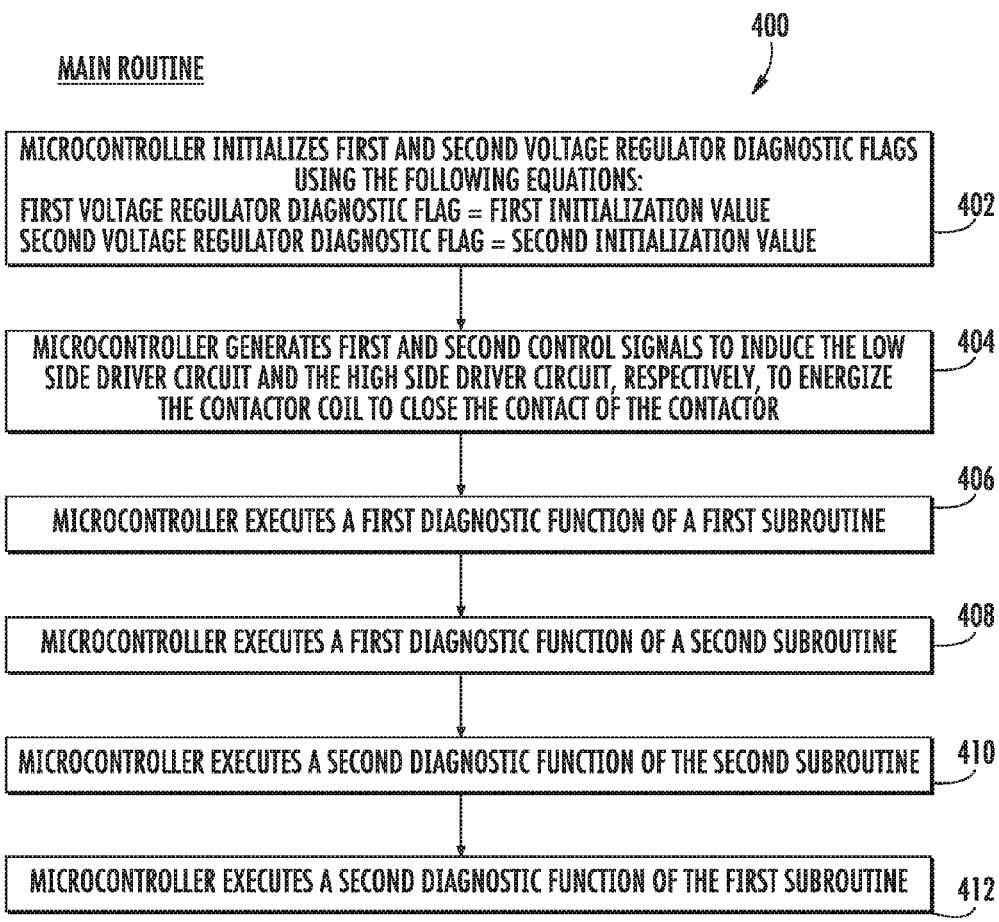
FIGS. 2-6 are flowcharts of a method for performing diagnostic tests on a voltage regulator in accordance with another exemplary embodiment.

The microcontroller 20 executes a main routine or program 400 (shown in FIG. 2 which calls functions of other subroutines for performing the diagnostic tests and for implementing control steps based on the results of the diagnostic tests. The main routine 400 will now be described.

At step 402, the microcontroller 20 initializes first and second voltage regulator diagnostic flags using the following equations:

first voltage regulator diagnostic flag=first initialization value; and second voltage regulator diagnostic flag=second initialization value.

After step 402, the method advances to step 404.

At step 404, the microcontroller 20 generates first and second control signals to induce the low side driver circuit 22 and the high side driver circuit 40, respectively, to energize the contactor coil 180 to close the contact 182 of the contactor 60. After step 404, the method advances to step 406.

At step 406, the microcontroller 20 executes a first diagnostic function 480 (shown in FIG. 3) of a first subroutine. After step 406, the method advances to step 408.

At step 408, the microcontroller 20 executes a first diagnostic function 530 (shown in FIG. 4) of a second subroutine. After step 408, the method advances to step 410.

At step 410, the microcontroller 20 executes a second diagnostic function 600 (shown in FIG. 5) of the second subroutine. After step 410, the method advances to step 412.

At step 412, the microcontroller 20 executes a second diagnostic function 650 of the first subroutine. After step 412, the method is exited.

Figure 3:
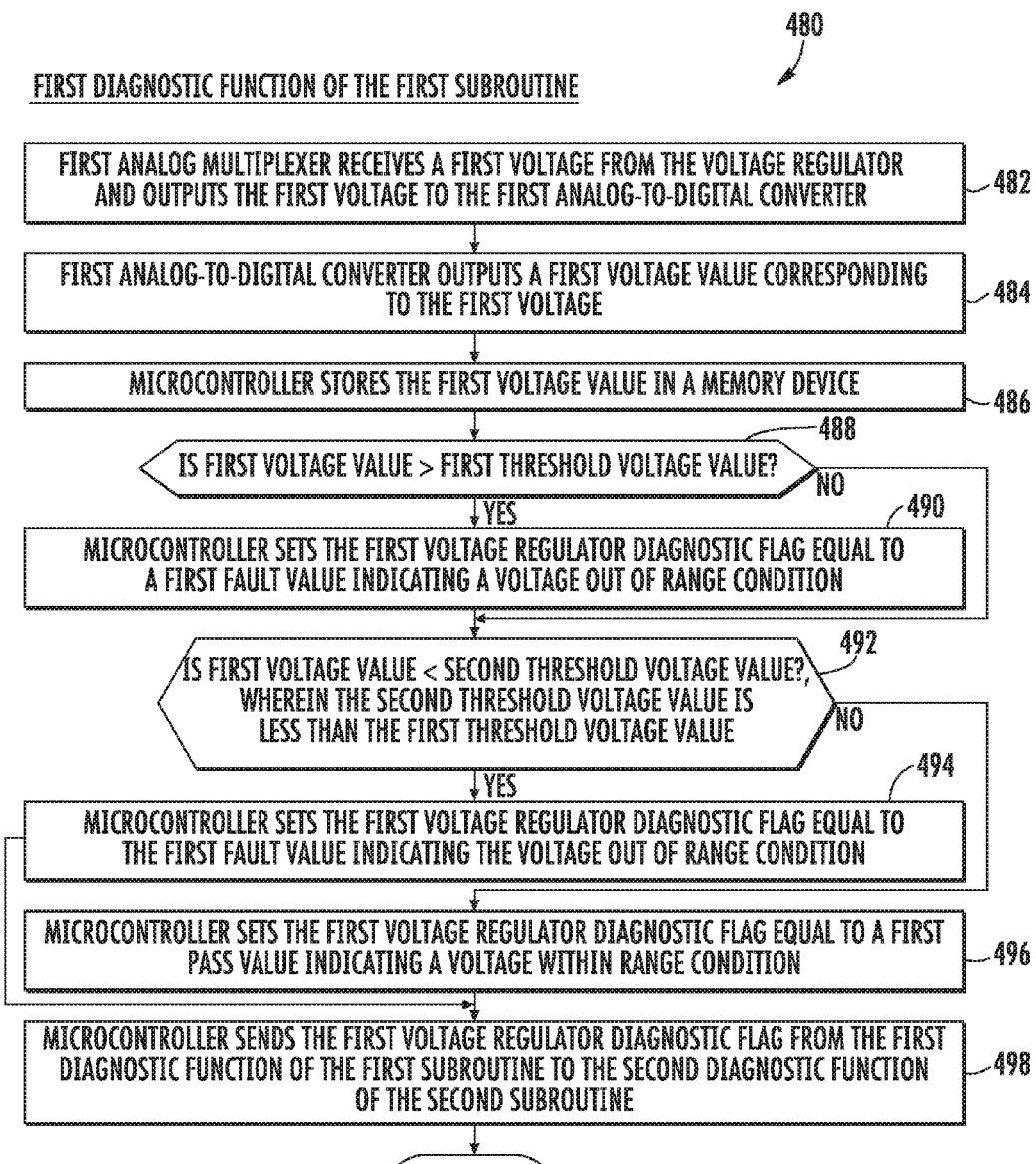

Referring to FIG. 3, the first diagnostic function 480 of the first subroutine will now be explained.

At step 482, the first analog multiplexer 82 receives a first voltage from the voltage regulator 80 and outputs the first voltage to the first analog-to-digital converter 120. After step 482, the method advances to step 484.

At step 484, the first analog-to-digital converter 120 outputs a first voltage value corresponding to the first voltage. After step 484, the method advances to step 486.

At step 486, the microcontroller 20 stores the first voltage value in a memory device 118. After step 486, the method advances to step 488.

At step 488, the microcontroller 20 makes a determination as to whether the first voltage value is greater than a first threshold voltage value. If the value of step 488 equals "yes", the method advances to step 490. Otherwise, the method advances to step 492.

At step 490, the microcontroller 20 sets the first voltage regulator diagnostic flag equal to a first fault value indicating a voltage out of range condition. After step 490, the method advances to step 492.

At step 492, the microcontroller 20 makes a determination as to whether the first voltage value is less than a second threshold voltage value, wherein the second threshold voltage value is less than the first threshold voltage value. If the value of step 492 equals "yes", the method advances to step 494. Otherwise, the method advances to step 496.

At step 494, the microcontroller 20 sets the first voltage regulator diagnostic flag equal to the first fault value indicating the voltage out of range condition. After step 494, the method advances to step 498.

Referring again to step 492, if the value of step 492 equals "no", the method advances to step 496. At step 496, the microcontroller 20 sets the first voltage regulator diagnostic flag equal to a first pass value indicating a voltage within range condition. After step 496, the method advances to step 498.

At step 498, the microcontroller 20 sends the first voltage regulator diagnostic flag from the first diagnostic function 480 of the first subroutine to the second diagnostic function 600 (shown in FIG. 5) of the second subroutine. After step 498, the method returns to the main routine 400 (shown in FIG. 2).

Figure 4:
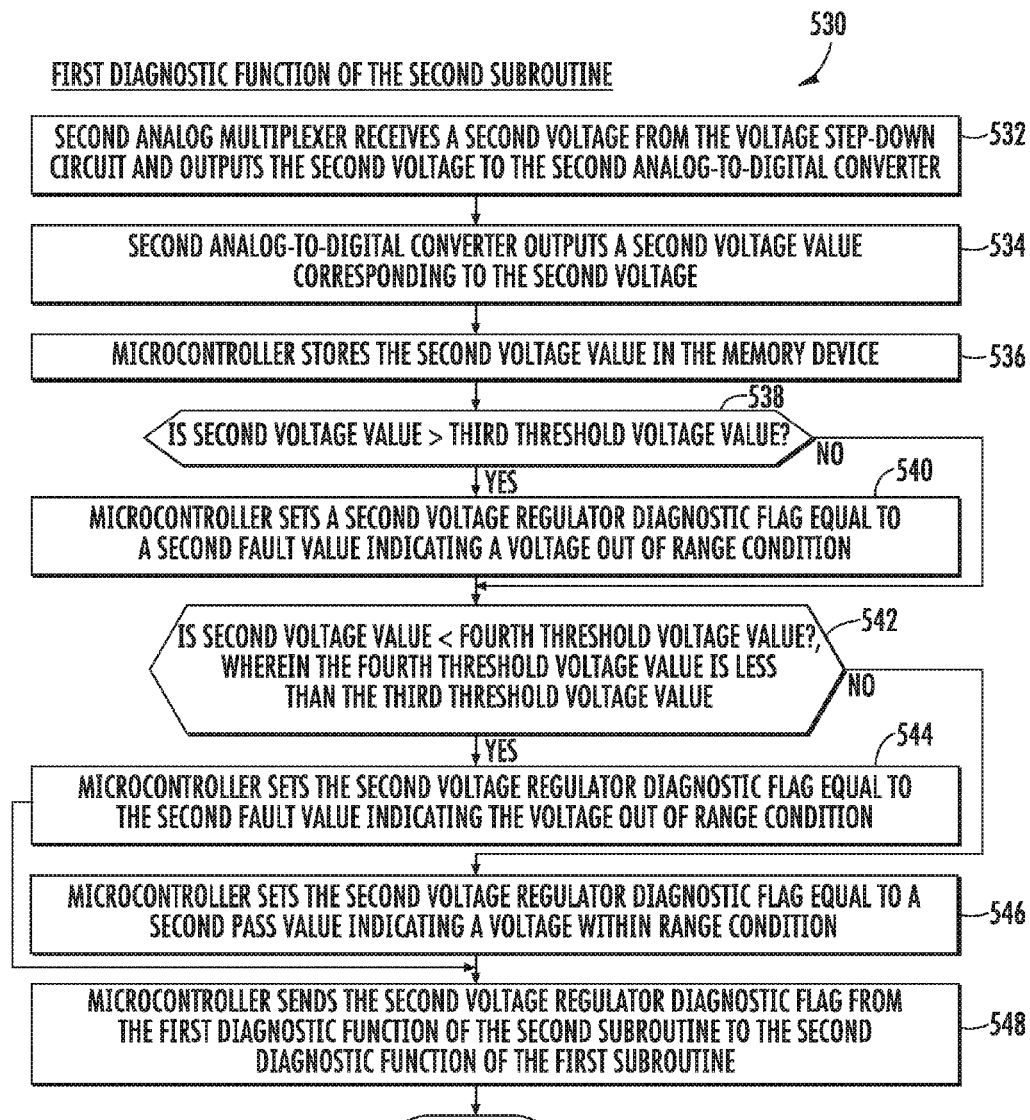

Referring to FIG. 4, the first diagnostic function 530 of the second subroutine will now be explained.

At step 532, the second analog multiplexer 86 receives a second voltage from the voltage step-down circuit 84 and outputs the second voltage to the second analog-to-digital converter 122. After step 532, the method advances to step 534.

At step 534, the second analog-to-digital converter 122 outputs a second voltage value corresponding to the second voltage. After step 534, the method advances to step 536.

At step 536, the microcontroller 20 stores the second voltage value in the memory device 118. After step 536, the method advances to step 538.

At step 538, the microcontroller 20 makes a determination as to whether the second voltage value is greater than a third threshold voltage value. If the value of step 538 equals "yes", the method advances to step 540. Otherwise, the method advances to step 542.

At step 540, the microcontroller 20 sets a second voltage regulator diagnostic flag equal to a second fault value indicating a voltage out of range condition. After step 540, the method advances to step 542.

At step 542, the microcontroller 20 makes a determination as to whether the second voltage value is less than a fourth threshold voltage value, wherein the fourth threshold voltage value is less than the third threshold voltage value. If the value of step 542 equals "yes", the method advances to step 544. Otherwise, the method advances to step 546.

At step 544, the microcontroller 20 sets the second voltage regulator diagnostic flag equal to the second fault value indicating the voltage out of range condition. After step 544, the method advances to step 548.

Referring again to step 542, if the value of step 542 equals "no", the method advances to step 546. At step 546, the microcontroller 20 sets the second voltage regulator diagnostic flag equal to a second pass value indicating a voltage within range condition. After step 546, the method advances to step 548.

At step 548, the microcontroller 20 sends the second voltage regulator diagnostic flag from the first diagnostic function 530 of the second subroutine to the second diagnostic function 650 (shown in FIG. 6) of the first subroutine. After step 548, the method returns to the main routine 400 (shown in FIG. 2).

Figure 5:
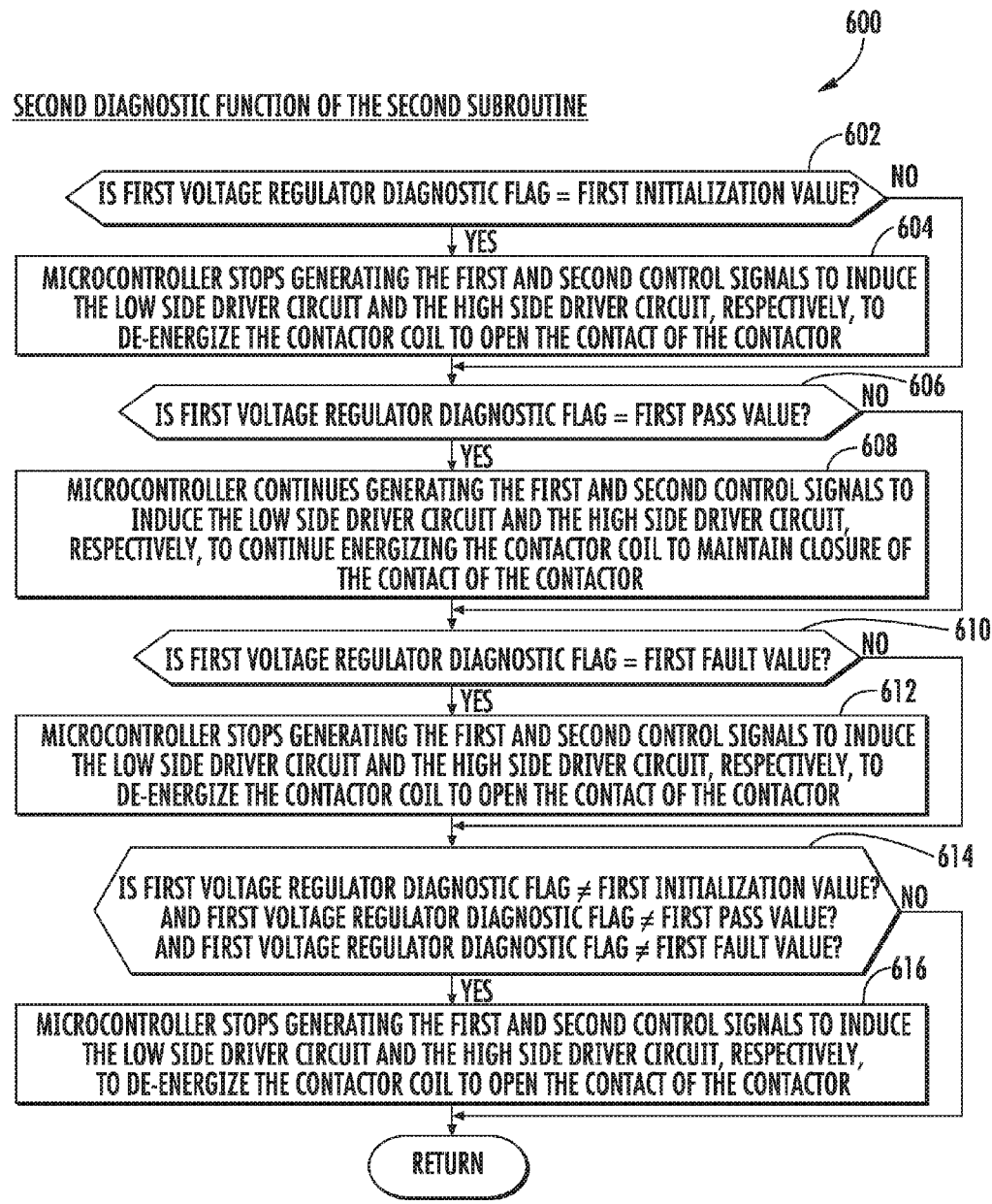

Referring to FIG. 5, the second diagnostic function 600 of the second subroutine will now be explained.

At step 602, the microcontroller 20 makes a determination as to whether the first voltage regulator diagnostic flag is equal to the first initialization value. If the value of step 602 equals "yes", the method advances to step 604. Otherwise, the method advances to step 606.

At step 604, the microcontroller 20 stops generating the first and second control signals to induce the low side driver circuit 22 and the high side driver circuit 40, respectively, to de-energize the contactor coil 180 to open the contact 182 of the contactor 60. After step 604, the method advances to step 606.

At step 606, the microcontroller 20 makes a determination as to whether the first voltage regulator diagnostic flag is equal to the first pass value. If the value of step 606 equals "yes", the method advances to step 608. Otherwise, the method advances to step 610.

At step 608, the microcontroller 20 continues generating the first and second control signals to induce the low side driver circuit 22 and the high side driver circuit 40, respectively, to continue energizing the contactor coil 180 to maintain closure of the contact 182 of the contactor 60. After step 608, the method advances to step 610.

At step 610, the microcontroller 20 makes a determination as to whether the first voltage regulator diagnostic flag is equal to the first fault value. If the value of step 610 equals "yes", the method advances to step 612. Otherwise, the method advances to step 614.

At step 612, the microcontroller 20 stops generating the first and second control signals to induce the low side driver circuit 22 and the high side driver circuit 40, respectively, to de-energize the contactor coil 180 to open the contact 182 of the contactor 60. After step 612, the method advances to step 614.

At step 614, the microcontroller 20 makes a determination as to whether the first voltage regulator diagnostic flag is not equal to the first initialization value, and whether the first voltage regulator diagnostic flag is not equal to the first pass value, and whether the first voltage regulator diagnostic flag is not equal to the first fault value. If the value of step 614 equals "yes", the method advances to step 616. Otherwise, the method returns to the main routine 400 (shown in FIG. 2).

At step 616, the microcontroller 20 stops generating the first and second control signals to induce the low side driver circuit 22 and the high side driver circuit 40, respectively, to de-energize the contactor coil 180 to open the contact 182 of the contactor 60. After step 616, the method returns to the main routine 400 (shown in FIG. 2).

Figure 6:
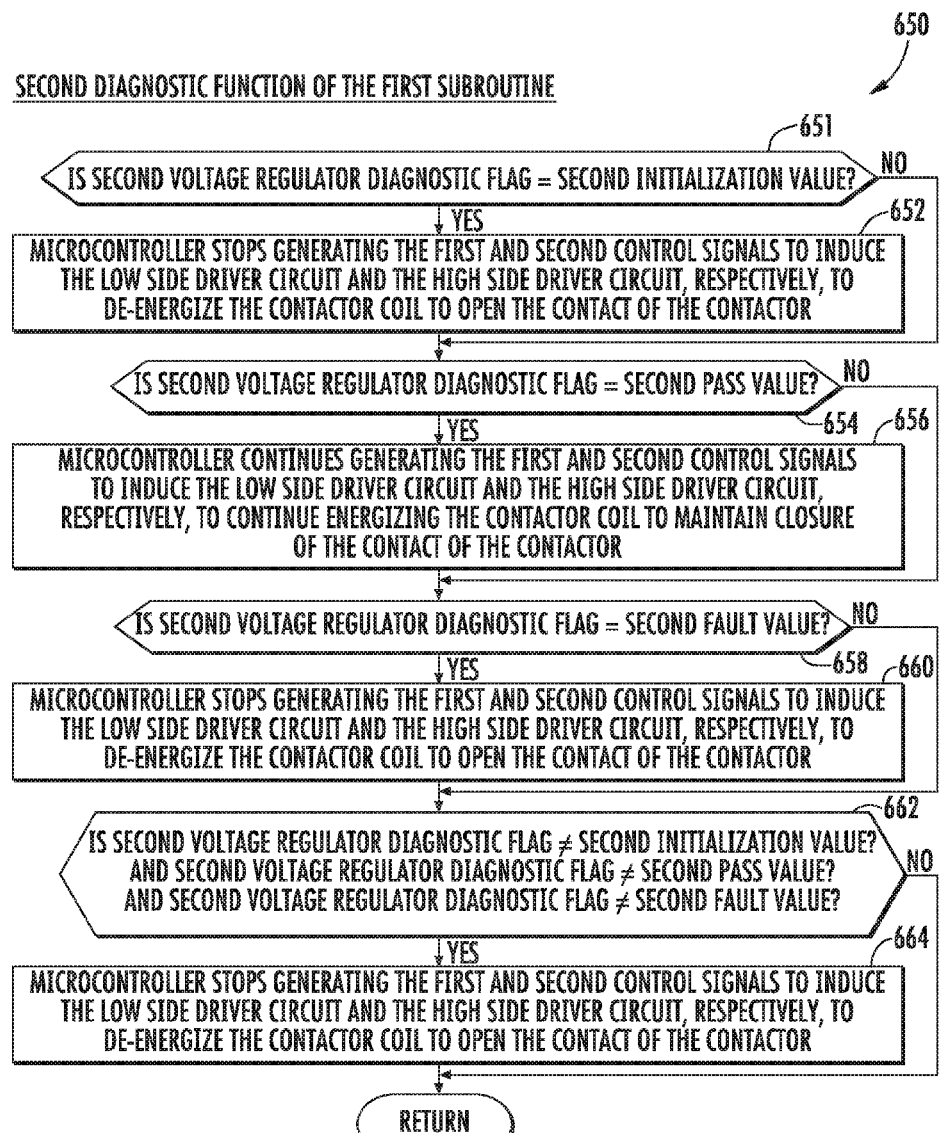

Referring to FIG. 6, the second diagnostic function 650 of the first subroutine will now be explained.

At step 651, the microcontroller 20 makes a determination as to whether the second voltage regulator diagnostic flag is equal to the second initialization value. If the value of step 651 equals "yes", the method advances to step 652. Otherwise, the method advances to step 654.

At step 652, the microcontroller 20 stops generating the first and second control signals to induce the low side driver circuit 22 and the high side driver circuit 40, respectively, to de-energize the contactor coil 180 to open the contact 182 of the contactor 60. After step 652, the method advances to step 654.

At step 654, the microcontroller 20 makes a determination as to whether the second voltage regulator diagnostic flag is equal to the second pass value. If the value of step 654 equals "yes", the method advances to step 656. Otherwise, the method advances to step 658.

At step 656, the microcontroller 20 continues generating the first and second control signals to induce the low side driver circuit 22 and the high side driver circuit 40, respectively, to continue energizing the contactor coil 180 to maintain closure of the contact 182 of the contactor 60. After step 656, the method advances to step 658.

At step 658, the microcontroller 20 makes a determination as to whether the second voltage regulator diagnostic flag is equal to the second fault value. If the value of step 658 equals "yes", the method advances to step 660. Otherwise, the method advances to step 662.

At step 660, the microcontroller 20 stops generating the first and second control signals to induce the low side driver circuit 22 and the high side driver circuit 40, respectively, to de-energize the contactor coil 180 to open the contact 182 of the contactor 60. After step 660, the method advances to step 662.

At step 662, the microcontroller 20 makes a determination as to whether the second voltage regulator diagnostic flag is not equal to the second initialization value, and whether the second voltage regulator diagnostic flag is not equal to the second pass value, and whether the second voltage regulator diagnostic flag is not equal to the second fault value. If the value of step 662 equals "yes", the method advances to step 664. Otherwise, the method returns to the main routine 400 (shown in FIG. 2).

At step 664, the microcontroller 20 stops generating the first and second control signals to induce the low side driver circuit 22 and the high side driver circuit 40, respectively, to de-energize the contactor coil 180 to open the contact 182 of the contactor 60. After step 664, the method returns to the main routine 400 (shown in FIG. 2).

The diagnostic system for a voltage regulator described herein provides a substantial advantage over other systems and methods. In particular, the diagnostic system provides a technical effect of implementing diagnostic diversity by utilizing a first voltage output by a voltage regulator or a second voltage output by a voltage step-down circuit coupled to the voltage regulator, to determine whether the voltage regulator is operating as desired, and if not then opening a contactor.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a voltage regulator, comprising:
a microcontroller having first and second analog-to-digital converters and first and second output ports;
a first analog multiplexer having an input port and an output port, the output port of the first analog multiplexer being electrically coupled to the first analog-to-digital converter; the input port of the first analog multiplexer being electrically coupled to the voltage regulator;
a second analog multiplexer having an input port and an output port, the output port of the second analog multiplexer being electrically coupled to the second analog-to-digital converter;
a voltage step-down circuit having an input node and an output node, the input node of the voltage step-down circuit being electrically coupled to the voltage regulator, the output node of the voltage step-down circuit being electrically coupled to the input port of the second analog multiplexer;
the first analog multiplexer receiving a first voltage from the voltage regulator and outputting the first voltage to the first analog-to-digital converter;
the first analog-to-digital converter outputting a first voltage value corresponding to the first voltage from the voltage regulator; and
the microcontroller being programmed to execute a first diagnostic function to set a first voltage regulator diagnostic flag equal to a fault value indicating a voltage out of range condition, if the first voltage value is greater than a first threshold voltage value or the first voltage value is less than a second threshold voltage value.

2. The diagnostic system of claim 1, wherein the microcontroller being further programmed to execute a second diagnostic function to stop generating first and second control signals to de-energize a contactor coil to open a contact of a contactor if the first voltage regulator diagnostic flag is equal to the fault value.

3. A diagnostic system for a voltage regulator, comprising:

a microcontroller having first and second analog-to-digital converters and first and second output ports;

a first analog multiplexer having an input port and an output port, the output port of the first analog multiplexer being electrically coupled to the first analog-to-digital converter; the input port of the first analog multiplexer being electrically coupled to the voltage regulator;

a second analog multiplexer having an input port and an output port, the output port of the second analog multiplexer being electrically coupled to the second analog-to-digital converter;

a voltage step-down circuit having an input node and an output node, the input node of the voltage step-down circuit being electrically coupled to the voltage regulator, the output node of the voltage step-down circuit being electrically coupled to the input port of the second analog multiplexer;

the second analog multiplexer receiving a first voltage from the output node of the voltage step-down circuit and outputting the first voltage to the second analog-to-digital converter;

the second analog-to-digital converter outputting a first voltage value corresponding to the first voltage from the voltage step-down circuit; and the microcontroller being programmed to execute a first diagnostic function to set a first voltage regulator diagnostic flag equal to a fault value indicating a voltage out of range condition, if the first voltage value is greater than a first threshold voltage value or the first voltage value is less than a second threshold voltage value.

4. The diagnostic system of claim 3, wherein the microcontroller being further programmed to execute a second diagnostic function to stop generating first and second control signals to de-energize a contactor coil to open a contact of a contactor if the first voltage regulator diagnostic flag is equal to the fault value.

* * * * *